(12) United States Patent
Yu

(10) Patent No.: US 6,739,895 B2
(45) Date of Patent: May 25, 2004

(54) ELECTRICAL CONNECTOR WITH STRENGTHENED ACTUATION DEVICE

(75) Inventor: Wei Yu, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/375,955

(22) Filed: Feb. 27, 2003

(65) Prior Publication Data

US 2004/0002231 A1 Jan. 1, 2004

(30) Foreign Application Priority Data

Jun. 28, 2002 (TW) ...................................... 91209757 U

(51) Int. Cl.⁷ .......................... H01R 4/50; H01R 13/625
(52) U.S. Cl. ........................................ 439/342; 439/331
(58) Field of Search ........................... 439/44, 342, 259, 439/331

(56) References Cited

U.S. PATENT DOCUMENTS

| | | | | |
|---|---|---|---|---|
| 5,489,218 A | * | 2/1996 | McHugh | ...................... 439/342 |
| 5,679,020 A | * | 10/1997 | Lai et al. | ...................... 439/342 |
| 5,722,848 A | * | 3/1998 | Lai et al. | ...................... 439/342 |
| 5,833,483 A | * | 11/1998 | Lai et al. | ...................... 439/342 |
| 6,368,137 B1 | * | 4/2002 | Orwoll | ......................... 439/331 |
| 6,406,317 B1 | * | 6/2002 | Li et al. | ...................... 439/342 |
| 6,419,514 B1 | * | 7/2002 | Yu | .............................. 439/342 |

* cited by examiner

Primary Examiner—Michael C. Zarroli
(74) Attorney, Agent, or Firm—Wei Te Chung

(57) ABSTRACT

An electrical connector (1) for electrically connecting an electronic package with a circuit substrate. The connector includes a base (2), a cover (3) slidably attached on the base, and an actuation device (4) for actuating the cover to slide along the base. The actuation device includes a camshaft (42) and an operation lever (41). The camshaft includes first actuating portions (43), and a central second actuating portion (44). During opening and closing of the cover, the first actuating portions and the second actuating portion are respectively at work. This ensures that diameters of the different portions of the camshaft are different. Thus the camshaft can have sufficiently high tension to minimize the risk of it being distorted. When the lever is rotated to a vertical position, the first actuating portions are engaged with second flat side walls (251) of the base. This helps prevent the lever from being over-rotated.

20 Claims, 4 Drawing Sheets

ELECTRICAL CONNECTOR WITH STRENGTHENED ACTUATION DEVICE

BACKGROUND OF THE INVENTION

1. Field of the Invention

The present invention relates to an electrical connector for electrically connecting an electronic package such as a central processing unit (CPU) with a circuit substrate such as a printed circuit board (PCB), and particularly to an electrical connector with a strengthened actuation device that actuates connection and disconnection of the CPU with and from the electrical connector.

2. Description of Prior Art

Electrical connectors are widely used in personal computer (PC) systems for electrically connecting electronic packages such as CPUs with circuit substrates such as PCBs. Typical such electrical connectors are known as CPU sockets. A typical CPU socket comprises a base soldered and electrically connected with the PCB, a cover slidably mounted on the base and having a CPU attached thereon, and an actuation device for actuating the cover to slide along the base.

The CPU has a multiplicity of pins depending from a bottom surface thereof and arranged in a rectangular array. The cover of the CPU socket has a multiplicity of through holes arranged in a rectangular array corresponding to the pins of the CPU. The base of the CPU socket has a multiplicity of passageways arranged in a rectangular array corresponding to the pins of the CPU. Each passageway receives an electrical terminal therein.

In use, the CPU is attached to the CPU socket. The pins of the CPU extend through the corresponding through holes of the cover and are received in the corresponding passageways of the base. The pins of the CPU do not contact the corresponding electrical terminals. Thus the CPU is attached with zero insertion force. In particular, the pins of the CPU are prevented from being flexed by sudden force being applied thereto by the electrical terminals. Then, the actuation device actuates the cover to slide along the base. When the cover reaches a closed position with respect to the base, the actuation device pushes the pins of the CPU into mechanical and electrical engagement with the corresponding electrical terminals.

This kind of conventional CPU socket is detailed in "Development of a ZIF BGA Socket" (pp16~18, May 2000, Connector Specifier Magazine). Similar kinds of CPU sockets are also disclosed in Taiwan Patent Issue Nos. 394472, 481375, 481378, 443622, and 462542.

Taiwan Patent Issue Nos. 394472, 481375, 481378, 443622 and 462542 each disclose a CPU socket comprising an actuation device positioned between a base and a cover. The actuation device comprises a camshaft for actuating the cover to slide along the base, and an operation lever extending perpendicularly from one end of the camshaft to facilitate manual handling by a user. During an opening process, actuating portions of the camshaft are at work at the same time; and during a closing process, the same actuating portions are also at work at the same time. This results in diameters of the actuating portions being much smaller than diameters of other portions of the camshaft. Accordingly, a total tension of the camshaft is reduced, and the camshaft is prone to distort.

Furthermore, when the CPU is attached on or removed from the CPU socket, the operation lever is rotated upwardly to a position perpendicular to the base. At this position, the operation lever is blocked from further rotation by a stop provided at a side of the base. However, the operation lever is still prone to be accidentally rotated beyond said perpendicular position. When this happens, the CPU socket may be damaged.

A new electrical connector that overcomes the above-mentioned disadvantages is desired.

SUMMARY OF THE INVENTION

Accordingly, an object of the present invention is to provide an electrical connector for electrically connecting an electronic package such as a CPU with a circuit substrate such as a PCB, the electrical connector having a strengthened actuation device.

Another object of the present invention is to provide an electrical connector configured to help prevent an actuation device thereof from being over-rotated.

To achieve the above-mentioned objects, an electrical connector in accordance with a preferred embodiment of the present invention is for electrically connecting a CPU with a PCB. The electrical connector comprises a generally rectangular insulative base, a cover slidably attached on the base, and an actuation device for actuating the cover to slide along the base.

The actuation device comprises a camshaft and an operation lever. The camshaft is positioned between the base and the cover, and the operation lever extends perpendicularly from one end of the camshaft. The operation lever is positioned substantially outside the base and the cover, to facilitate manual handling by a user. The camshaft comprises first actuating portions, a central second actuating portion and outmost supporting portions. The base comprises outmost first locating portions, second locating portions and a central third locating portion, respectively receiving the supporting portions, the first actuating portions and the second actuating portion of the camshaft. During a closing process, the first actuating portions are at work; and during an opening process, the second actuating portion is at work. This ensures that diameters of the different portions of the camshaft are different. Thus the camshaft can have sufficiently high tension to minimize the risk of it being distorted.

Furthermore, when the operation lever is rotated to a position perpendicular to the base, the first actuating portions are engaged with second flat side walls of the second locating portions of the base. This helps prevent the operation lever from being rotated beyond said perpendicular position and causing damage to the electrical connector.

Other objects, advantages and novel features of the present invention will become more apparent from the following detailed description when taken in conjunction with the accompanying drawings, in which:

DETAILED DESCRIPTION OF PREFERRED EMBODIMENT OF THE INVENTION

Reference will now be made to the drawings to describe the present invention in detail.

Figure 1:
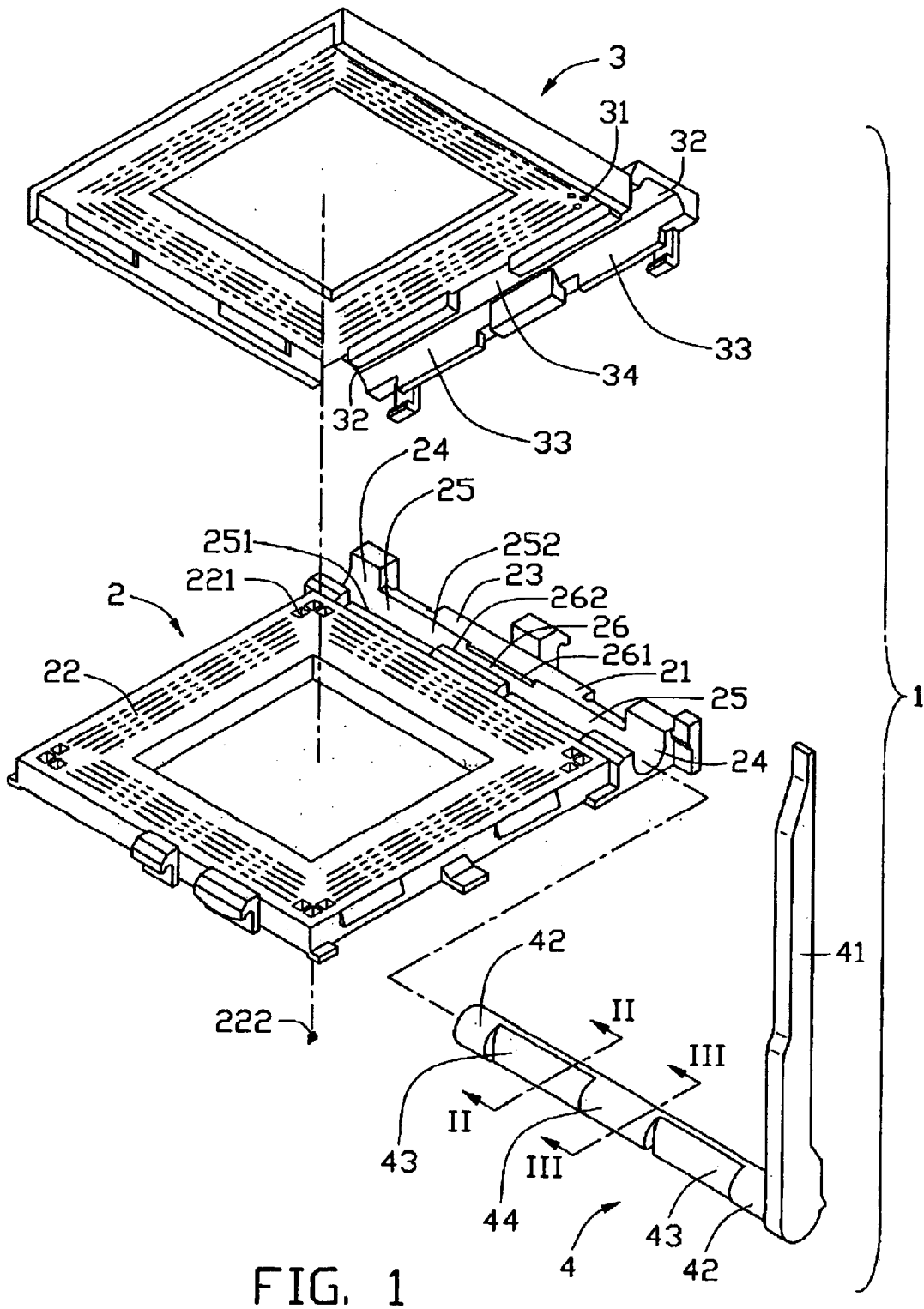
FIG. 1 is an exploded, isometric view of an electrical connector in accordance with a preferred embodiment of the present invention, the electrical connector comprising a cover, a base and an actuation device, the base and the actuation device being viewed from one aspect, and the cover being viewed from another aspect.
Figure 2:
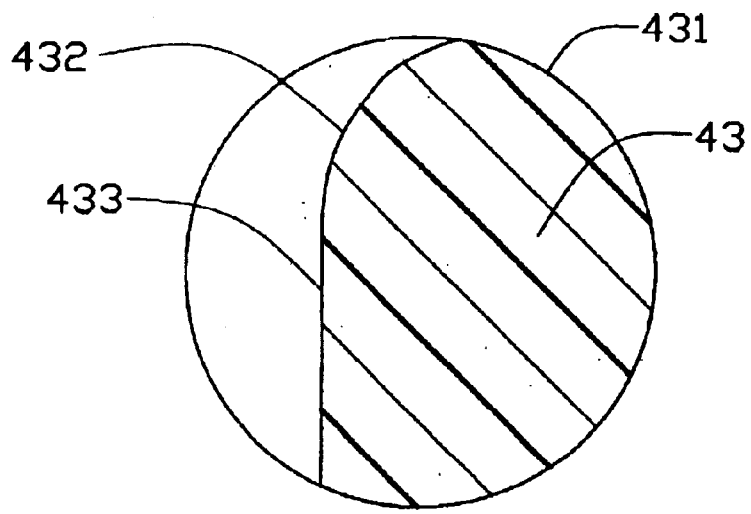
FIG. 2 is an enlarged, cross-sectional view of the actuation device of FIG. 1, taken along line II—II of FIG. 1.
Figure 3:
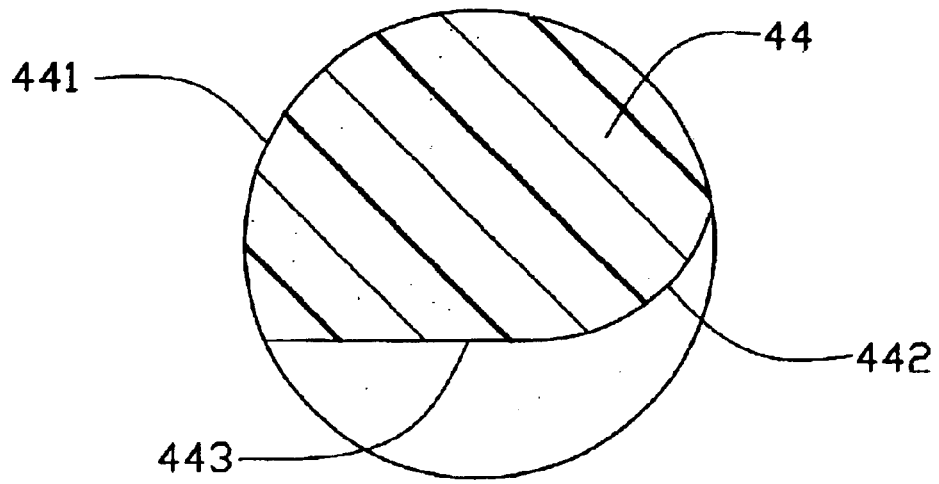
FIG. 3 is an enlarged, cross-sectional view of the actuation device of FIG. 1, taken along line III—III of FIG. 1.

Referring to FIGS. 1, 2 and 3, an electrical connector 1 in accordance with a preferred embodiment of the present invention is for electrically connecting a CPU (not shown) to a PCB (not shown). The electrical connector 1 comprises a generally rectangular insulative base 2, a cover 3 slidably attached on the base 2, and a actuation device 4 positioned between the base 2 and the cover 3 for actuating the cover 3 to slide along the base 2.

The actuation device 4 comprises a camshaft positioned between the base 2 and the cover 3, and an operation lever 41. The operation lever 41 extends perpendicularly from one end of the camshaft, and is positioned substantially outside the base 2 and the cover 3 to facilitate manual handling by a user. The camshaft comprises a pair of supporting portions 42 at opposite ends thereof, a pair of first actuating portions 43 adjacent the supporting portions 42, and a second actuating portion 44 between the first actuating portions 43. The supporting portions 42 are columnar. Each first actuating portion 43 sequentially comprises a first arched surface 431, a first actuating surface 432, and a first locating surface 433. The first actuating surface 432 is an arched surface, and the first locating surface 433 is a flat surface. The second actuating portion 44 sequentially comprises a second arched surface 441, a second actuating surface 442, and a second locating surface 443. The second actuating surface 442 is an arched surface, and the second locating surface 443 is a flat surface.

Projections of the first arched surface 431, the first actuating surface 432 and the first locating surface 433 of the first actuating portion 43 are respectively perpendicular to those of the second arched surface 441, the second actuating surface 442 and the second locating surface 443.

The base 2 comprises a front portion 21 integrally extending from a main portion 22. The main portion 22 defines a multiplicity of receiving passageways 221 arranged in a rectangular array. Each passageway 221 receives an electrical terminal 222 therein, and the electrical terminals 222 are electrically connected with the PCB. The front portion 21 defines an engaging surface 23 for engaging with the cover 3. The engaging surface 23 defines a longitudinal locating slot for locating the camshaft of the actuation device 4. The front portion 21 forms a pair of first locating portions 24 at respective opposite ends of the locating slot, a third locating portion 26 between the first locating portions 24, and a pair of second locating portions 25 respectively between the first and third locating portions 24, 26.

Each second locating portion 25 comprises a second flat side wall 251 nearest the main portion 22, and a second arched side wall 252 opposite from the second flat side wall 251. The third locating portion 26 comprises a third arched side wall 262 nearest the main portion 22, and a third flat side wall 261 opposite from the third arched side wall 262. The second flat side wall 251 and the third flat side wall 261 are locating walls.

The cover 3 defines a multiplicity of through holes 31 arranged in a rectangular array corresponding to the receiving passageways 221 of the base 2, and a longitudinal receiving slot corresponding to the locating slot of the base 2 for receiving the camshaft of the actuation device 4. The cover 3 at the receiving slot comprises a pair of first receiving portions 32 cooperating with the first locating portions 24, a pair of second receiving portions 33 cooperating with the second locating portions 25, and a third receiving portion 34 cooperating with the third locating portion 26. A width of the receiving slot at each second receiving portion 33 and a width of the receiving slot at the third receiving portion 34 are substantially equal to a diameter of each supporting portion 42. The second receiving portions 33 are offset from the third receiving portion 34 with reference to a direction that the cover 3 slides along the base 2.

Figure 4:
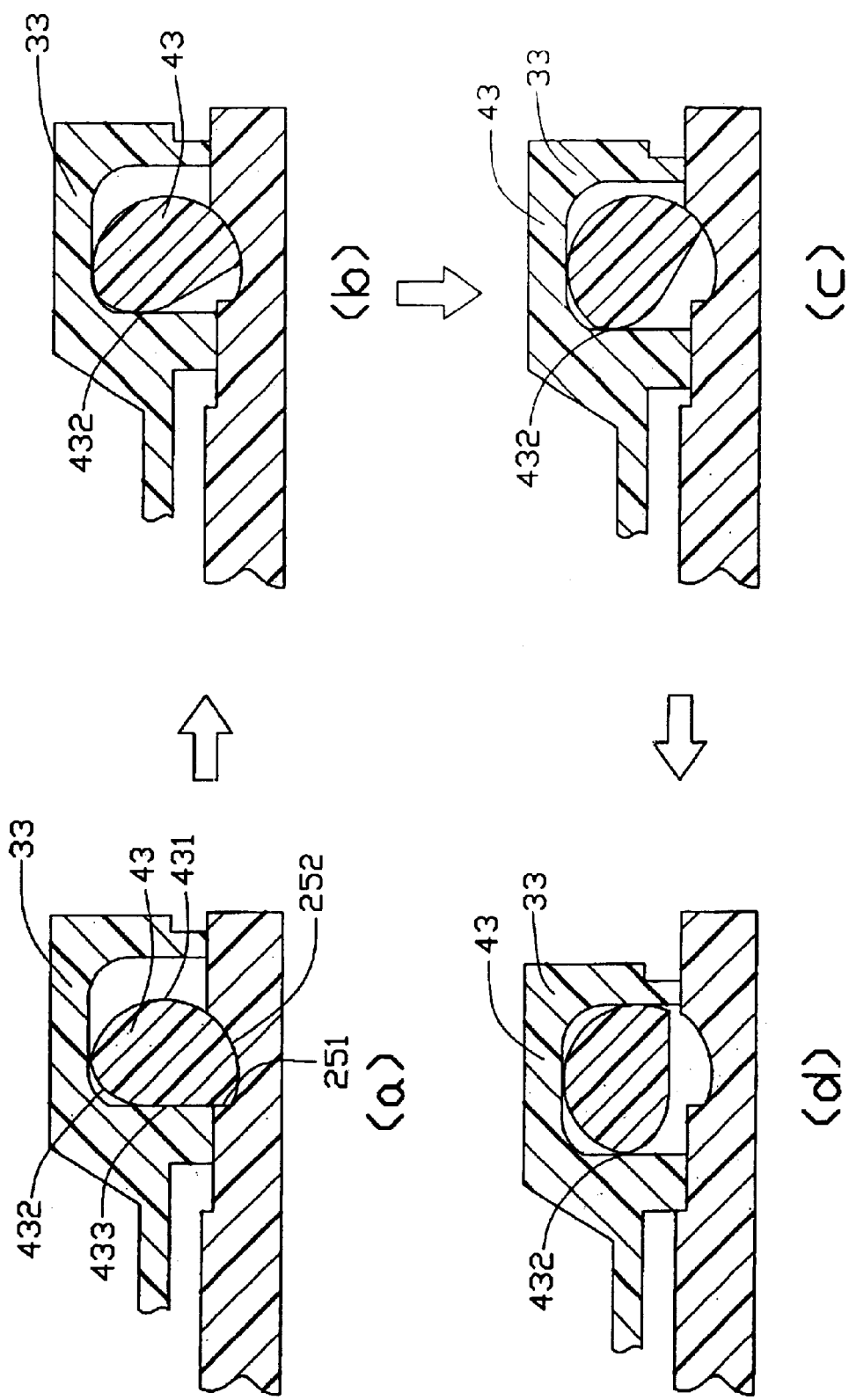
FIG. 4 is an enlarged, cross-sectional view of a front portion of the electrical connector of FIG. 1 fully assembled, corresponding to line II—II of FIG. 1, and showing successive stages in a closing process whereby a camshaft of the actuation device pushes the cover along the base in a rearward direction.
Figure 5:
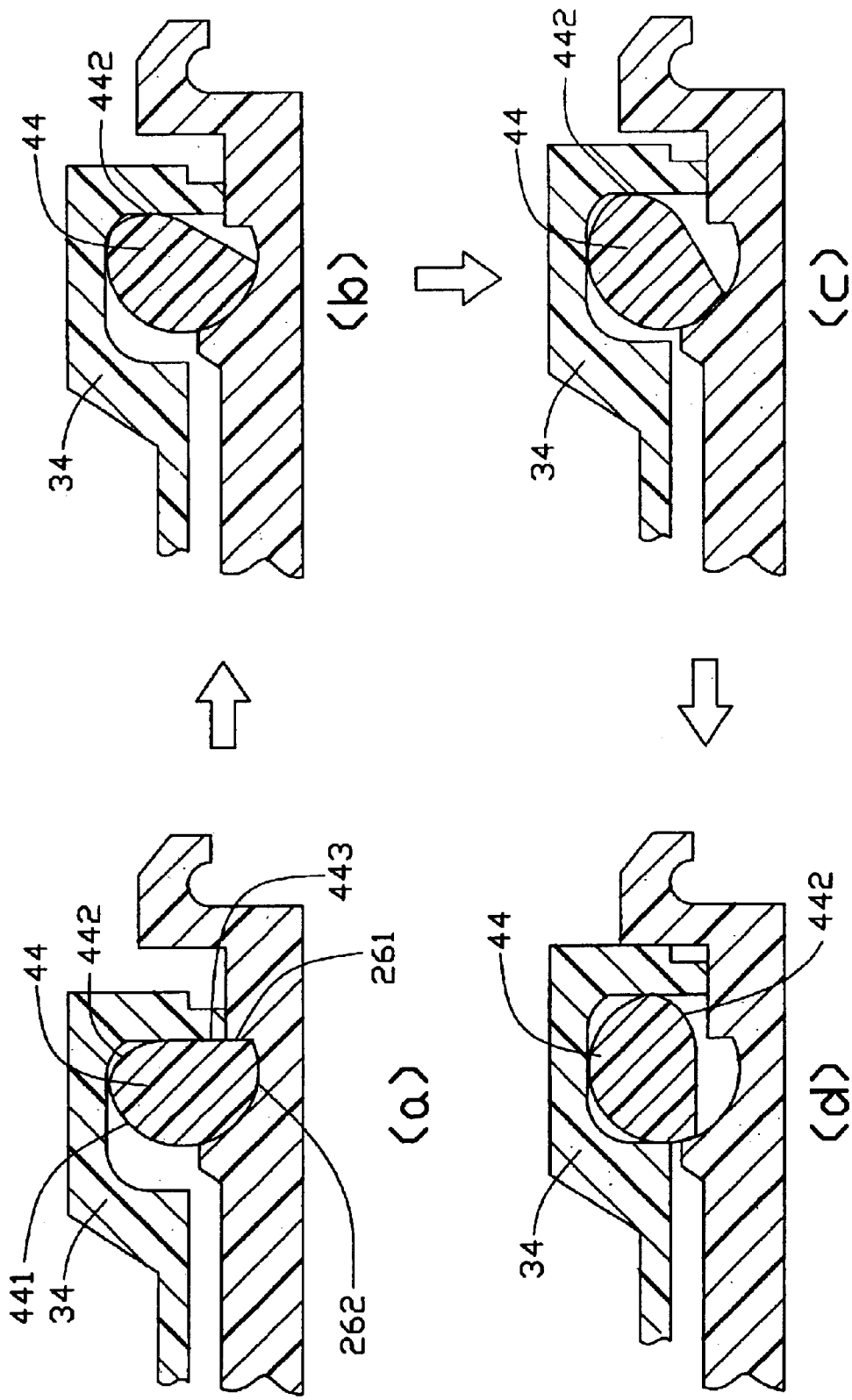
FIG. 5 is an enlarged, cross-sectional view of the front portion of the electrical connector of FIG. 1 fully assembled, corresponding to line III—III of FIG. 1, and showing successive stages in an opening process whereby the camshaft of the actuation device pushes the cover along the base in a forward direction.

When the operation lever 41 of the actuation device 4 is rotated to a position perpendicular to the base 2, the CPU is attached on the cover 3, and the pins of the CPU extend through the through holes 31 of the cover 3 and into the corresponding receiving passageways 221 of the base 2 without contacting the corresponding electrical terminals 222 of the base 2. When the operation lever 41 is rotated down from said perpendicular position to a position parallel to and alongside the base 2, the actuation device 4 pushes the cover 3 to slide along the base 2 in a rearward direction. This results in the pins of the CPU mechanically and electrically connecting with the corresponding electrical terminals 222. This process is defined as a closing process. When the operation lever 41 is rotated from said parallel position to said perpendicular position, the actuation device 4 pushes the cover 3 to slide along the base 2 in a forward direction. This results in the pins of the CPU mechanically and electrically disconnecting from the corresponding electrical terminals 222. This process is defined as an opening process. FIGS. 4 and 5 respectively show the closing process and the opening process.

FIGS. 4(a), (b), (c) and (d) respectively show an angle between either first locating surface 433 of the actuation device 4 and the base 2 being 90°, 60°, 30° and 0° during the closing process. In FIG. 4(a), the first locating surface 433 of the actuation device 4 is engaged with the corresponding second flat side wall 251 of the base 2 and the side wall of a corresponding second receiving portion 33 of the cover 3. This ensures that the first locating surface 433 of the actuation device 4 is apt to rotate down toward the base 2. In FIG. 4(b), the first actuating surface 432 of the actuation device 4 engages with the side wall of the second receiving portion 33 of the cover 3, and the cover 3 has been slid rearwardly a distance along the base 2 by the actuation device 4. In FIG. 4(c), the actuation device 4 continues to push the cover 3 to slide rearwardly along the base 2. In FIG. 4(d), the actuation device 4 has slid the cover 3 rearwardly a maximum distance along the base 2. At the same time, as shown in FIG. 5(a), the second locating surface 443 engages with the third flat side wall 261 of the base 2 and a side wall of the third receiving portion 34 of the cover 3, thereby positioning the actuation device 4 in a closed position.

FIGS. 5(a), (b), (c) and (d) respectively show an angle between the second locating surface 443 of the actuation device 4 and the base 2 being 90°, 60°, 30° and 0° during the opening process. In FIG. 5(a), the second locating surface 443 of the actuation device 4 is apt to rotate down toward the base 2. In FIG. 5(b), the second actuating surface 442 of the actuation device 4 engages with the side wall of the third receiving portion 34 of the cover 3, and the cover 3 has been pushed forwardly a distance along the base 2 by the actuation device 4. In FIG. 5(c), the actuation device 4 continues to push the cover 3 to slide forwardly along the base 2. In FIG. 5(d), the actuation device 4 has slid the cover 3 forwardly a maximum distance along the base 2.

During the closing process, the first actuating portions 43 are at work; and during the opening process, the second actuating portion 44 is at work. This ensures that diameters of the different portions of the camshaft are different. Thus the camshaft can have sufficiently high tension to minimize the risk of it being distorted. Furthermore, when the angle between the either first locating surface 433 of the actuation device 4 and the base 2 is 90°, the first actuating portions 43 are engaged with the second flat side walls 251 of the second locating portions 25 of the base 2. This helps prevent the operation lever 41 from being rotated beyond said perpendicular position and damaging the electrical connector 1.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electronic package with a circuit substrate, the electrical connector comprising:
    a base comprising a plurality of electrical terminals, a locating slot being defined in one end of the base;
    a cover slidably attached on the base, and defining a receiving slot corresponding to the locating slot of the base; and
    an actuation device movably positioned between the base and the cover, and comprising first actuating portions and a second actuating portion;
    wherein the first and second actuating portions share a common axis and each comprise a locating surface, the locating surfaces of the first actuating portions being offset at an angle from the locating surface of the second actuating portion.

2. The electrical connector as claimed in claim 1, wherein each of the first actuating portions of the actuation device comprises a first arched surface, a first actuating surface and a first locating surface, the second actuating portion of the actuation device comprises a second arched surface, a second actuating surface and a second locating surface, and the first locating surface is offset at said angle from the second locating surface.

3. The electrical connector as claimed in claim 2, wherein said angle is approximately 90 degrees.

4. The electrical connector as claimed in claim 1, wherein the base at the locating slot comprises first locating portions, second locating portions and a third locating portion.

5. The electrical connector as claimed in claim 4, wherein the cover at the receiving slot comprises first receiving portions, second receiving portions and a third receiving portion.

6. The electrical connector as claimed in claim 5, wherein the first actuating portions of the actuation device are received in the second locating portions of the base and the second receiving portions of the cover, and the second actuating portion of the actuation device is received in the third locating portion of the base and the third receiving portion of the cover.

7. The electrical connector as claimed in claim 6, wherein each of the second locating portions of the base comprises a second flat side wall and a second arched side wall.

8. The electrical connector as claimed in claim 6, wherein the third locating portion of the base comprise a third flat side wall and a third arched side wall.

9. An electrical connector for electrically connecting an electronic package with a circuit substrate, the electrical connector comprising:
    a base comprising an end portion defining a locating slot therein and a main portion receiving a plurality of electrical terminals therein, the end portion forming locating walls at the locating slot;
    a cover slidably attached on the base and defining a receiving slot corresponding to the locating slot of the base, the receiving slot and the locating slot cooperatively defining a receiving space; and
    an actuation device rotatably received in the receiving space, and comprising first actuating portions and a second actuating portion;
    wherein each of the first actuating portions has a first locating surface and the second actuating portion has a second locating surface, the first locating surface and the second locating surface are oriented at an angle relative to each other, and are respectively engaged with respective of the locating walls when the actuation device is rotated between an open position and a closed position.

10. The electrical connector as claimed in claim 9, wherein the base at the locating slot comprises first locating portions, second locating portions and a third locating portion, and the locating walls are respectively formed at the second locating portions and the third locating portion.

11. The electrical connector as claimed in claim 10, wherein the locating walls of the base are second flat side walls and a third flat side wall.

12. The electrical connector as claimed in claim 11, wherein each of the first locating surfaces and the second locating surface of the actuation device are flat surfaces.

13. The electrical connector as claimed in claim 10, wherein the cover at the receiving slot comprises first receiving portions, second receiving portions and a third receiving portion.

14. The electrical connector as claimed in claim 13, wherein the first actuating portions of the actuation device are received in the second locating portions of the base and the second receiving portions of the cover, and the second actuating portion of the actuation device is received in the third locating portion of the base and the third receiving portion of the cover.

15. The electrical connector as claimed in claim 9, wherein each of the first actuating portions of the actuation device comprises a first arched surface, a first actuating surface and the first locating surface, the second actuating portion of the actuation device comprises a second arched surface, a second actuating surface and the second locating surface.

16. The electrical connector as claimed in claim 9, wherein said angle is approximately 90 degrees.

17. An electrical connector comprising:
    an insulative base with a plurality of terminals therein;
    an insulative cover mounted on the base and moveable relative to the base in a front-to-back direction;

said base and said cover commonly defining a retaining slot extending in a transverse direction perpendicular to said front-to-back direction;

an actuation device received in the retaining slot and rotatable about an axis along said transverse direction; and first and second actuation portions formed on different axial positions along said axis, each of said first and second actuation portions defining opposite camming surface and abutment surface; wherein when the cover is in an open position relative to the base, the camming surface of the first actuation portion is engaged with the cover and the abutment surface of the first actuation portion is spaced from the cover, while the camming surface of the second actuation portion is spaced from the cover and the abutment surface of the second actuation portion is engaged with the cover;

in contrast, when the cover is in a closed position relative to the base, the camming surface of the first actuation portion is spaced from the cover and the abutment surface of the first actuation portion is engaged with the cover, while the camming surface of the second actuation portion is engaged with the cover and the abutment surface of the second actuation portion is spaced from the cover.

18. The connector as claimed in claim 17, wherein said abutment surface of each of said first and second actuation portions is planar.

19. The connector as claimed n claim 18, wherein said cover defines two planar surfaces to abut against the two abutment surfaces of the first and second actuation portions, respectively.

20. The connector as claimed in claim 19, wherein said base defines two planar surfaces in vertical alignment with said two planar surfaces of the cover, respectively, when said cover is in the respective open and closed positions, to abut against the two abutment surfaces of the first and second actuation portions, respectively.

* * * * *